United States Patent
Fujita et al.

(10) Patent No.: US 10,403,346 B2
(45) Date of Patent: Sep. 3, 2019

(54) SEMICONDUCTOR MEMORY DEVICE

(71) Applicants: TOSHIBA MEMORY CORPORATION, Minato-ku, Tokyo (JP); SK HYNIX INC., Icheon-si, Gyeonggi-do (KR)

(72) Inventors: Katsuyuki Fujita, Nishitokyo Tokyo (JP); Hyuck Sang Yim, Seoul (KR)

(73) Assignees: TOSHIBA MEMORY CORPORATION, Tokyo (JP); SK HYNIX INC., Icheon-si (KR)

( * ) Notice: Subject to any disclaimer, the term of this patent is extended or adjusted under 35 U.S.C. 154(b) by 0 days.

(21) Appl. No.: 15/903,999

(22) Filed: Feb. 23, 2018

(65) Prior Publication Data
US 2018/0182442 A1  Jun. 28, 2018

Related U.S. Application Data

(63) Continuation of application No. PCT/JP2016/057482, filed on Mar. 3, 2016.
(Continued)

(51) Int. Cl.
G11C 16/04 (2006.01)
G11C 11/16 (2006.01)
(Continued)

(52) U.S. Cl.
CPC ............ *G11C 11/1673* (2013.01); *G05F 1/56* (2013.01); *G11C 5/147* (2013.01); *G11C 7/04* (2013.01);
(Continued)

(58) Field of Classification Search
CPC ....... G11C 11/1673; G11C 5/147; G11C 7/04; G11C 7/12; G11C 11/1697; G11C 11/4076; G05F 1/56
(Continued)

(56) References Cited

U.S. PATENT DOCUMENTS 5,889,699 A * 3/1999 Takano ............... G11C 11/5621
                                                    365/185.18
5,929,539 A * 7/1999 Kozaru .................. G05F 1/465
                                                    307/130
(Continued)

FOREIGN PATENT DOCUMENTS

JP  2006155846 A  6/2006
JP  2010003345 A  1/2010
JP  2010079974 A  4/2010

OTHER PUBLICATIONS

International Search Report (ISR) and Written Opinion dated Apr. 26, 2016 issued in International Application No. PCT/JP2016/057482.

*Primary Examiner* — Xiaochun L Chen
(74) *Attorney, Agent, or Firm* — Holtz, Holtz & Volek PC

(57) ABSTRACT

According to one embodiment, a semiconductor memory device comprises a first bank and a second bank. Each of the first bank and the second bank comprises a memory cell having a variable resistor element, a reference cell, a sense amplifier having a first input terminal electrically coupled to the memory cell and a second input terminal electrically coupled to the reference cell, and a first transistor electrically coupling the memory cell and the first input terminal of the sense amplifier. A gate of the first transistor of the first hank and a gate of the first transistor of the second bank are independently supplied with a voltage.

15 Claims, 9 Drawing Sheets

Related U.S. Application Data

(60) Provisional application No. 62/216,179, filed on Sep. 9, 2015.

(51) Int. Cl.
*G11C 13/00* (2006.01)
*G05F 1/56* (2006.01)
*G11C 5/14* (2006.01)
*G11C 7/04* (2006.01)
*G11C 7/12* (2006.01)
*G11C 11/4076* (2006.01)
*G11C 11/4094* (2006.01)

(52) U.S. Cl.
CPC ............ *G11C 7/12* (2013.01); *G11C 11/1697* (2013.01); *G11C 11/4076* (2013.01); *G11C 11/4094* (2013.01); *G11C 13/004* (2013.01); *G11C 13/0038* (2013.01); *G11C 2013/0054* (2013.01); *G11C 2207/002* (2013.01)

(58) Field of Classification Search
USPC .......................................................... 365/149
IPC .................... G11C 11/1673,5/147, 7/04, 7/12, 11/1697, 11/4076, 11/4094, 13/004; G05F 1/56
See application file for complete search history.

(56) References Cited

U.S. PATENT DOCUMENTS

| | | |
|---|---|---|
| 9,799,385 B2 | 10/2017 | Fujita |
| 2003/0042971 A1 | 3/2003 | Oikawa et al. |
| 2009/0201738 A1* | 8/2009 | Sato .................. G11C 16/0483 365/185.17 |
| 2009/0316470 A1 | 12/2009 | Takizawa et al. |
| 2010/0034025 A1 | 2/2010 | Yanagidaira et al. |
| 2010/0073992 A1 | 3/2010 | Ueda |
| 2010/0103762 A1* | 4/2010 | Tzou ....................... G11C 8/12 365/230.03 |
| 2014/0071745 A1 | 3/2014 | Kawasumi |

\* cited by examiner

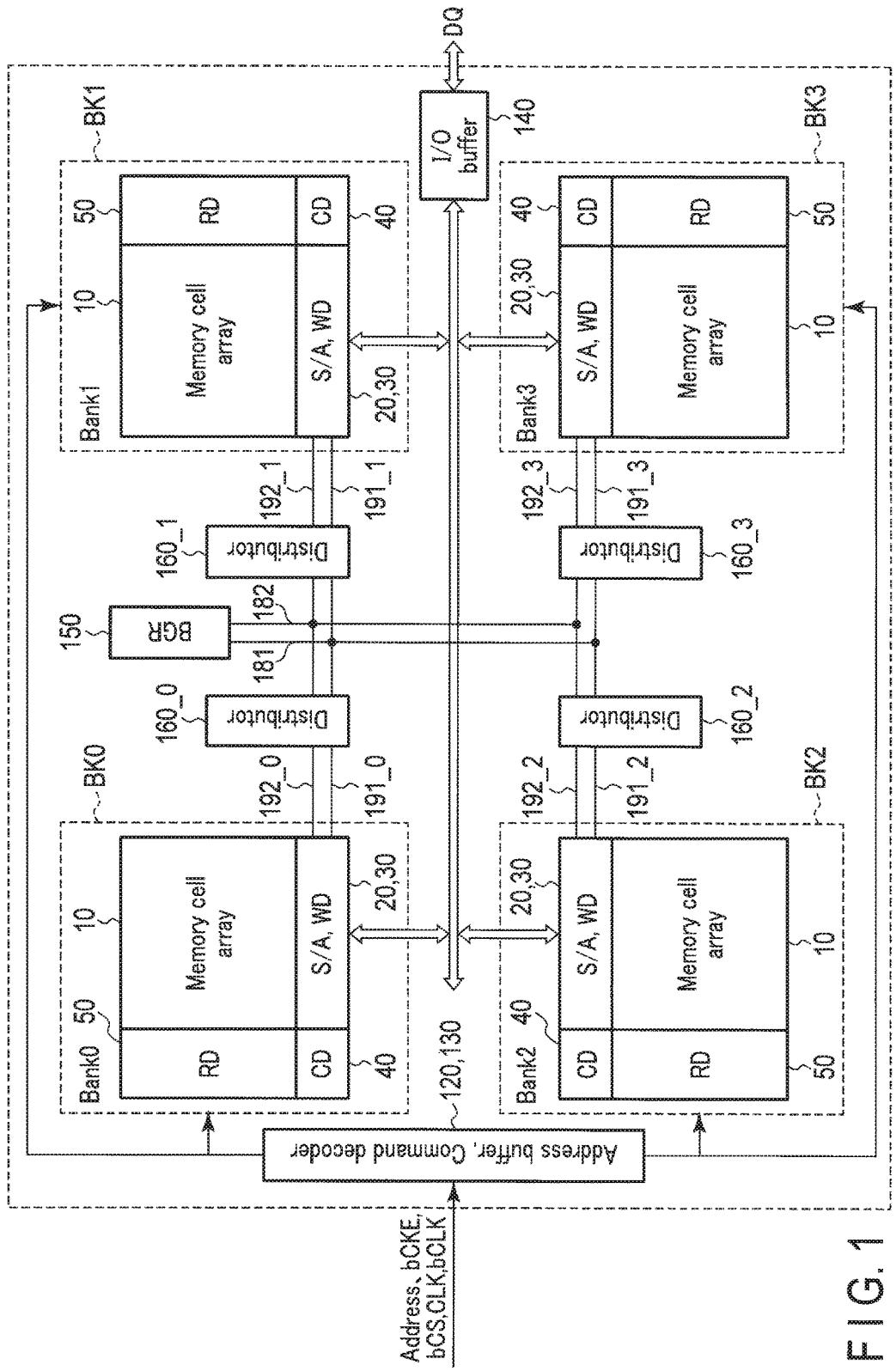
F I G. 1

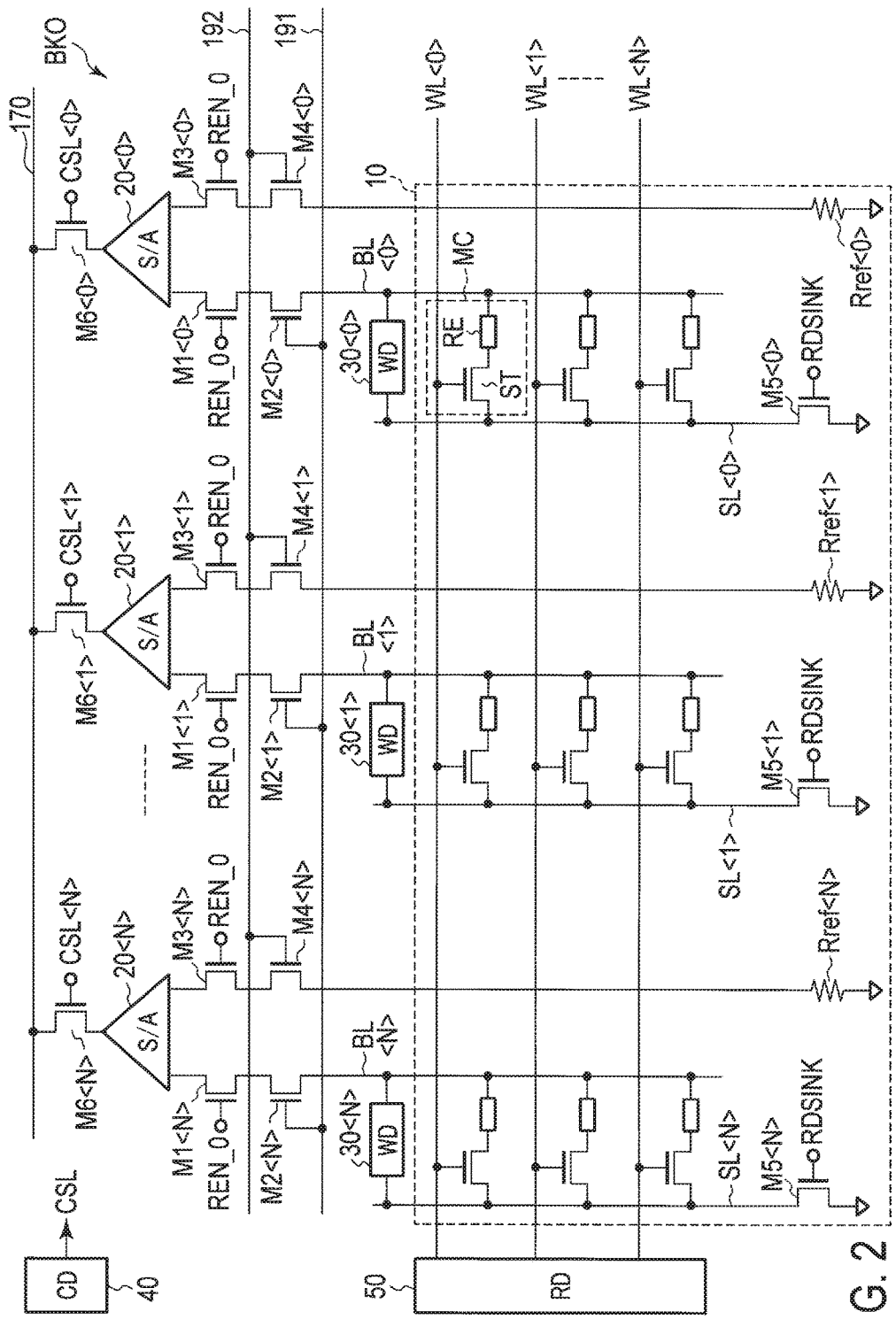
F I G. 2

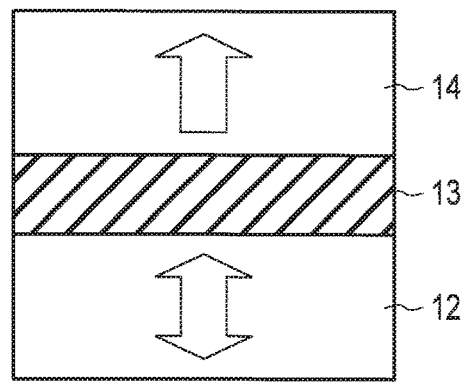
FIG. 3A
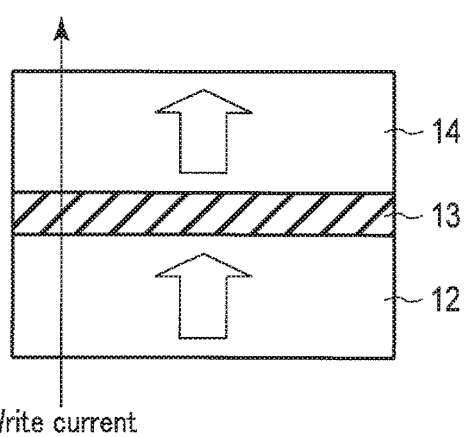
FIG. 3B  Parallel state (low resistance)
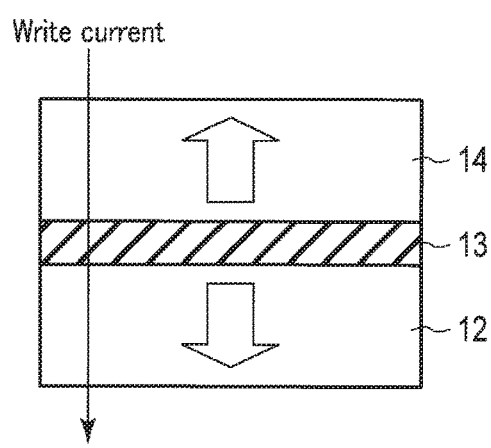
FIG. 3C  Anti-parallel state (high resistance)

SEMICONDUCTOR MEMORY DEVICE

CROSS REFERENCE TO RELATED APPLICATIONS

This application is a Continuation Application of PCT Application No. PCT/JP2016/057482, filed Mar. 3, 2016 and based upon and claims the benefit of priority from U.S. Provisional Application No. 62/216,179, filed Sep. 9, 2015, the entire contents of all of which are incorporated herein by reference.

FIELD

Embodiments relate to a semiconductor memory device.

BACKGROUND

An MRAM (Magnetic Random Access Memory) uses an MTJ (Magnetic Tunnel Junction) element having a magneto-resistance effect as a memory cell. The MRAM is characterized by high-speed operation, large-capacity and non-volatility, and noted as a next-generation memory device.

BRIEF DESCRIPTION OF THE DRAWINGS

FIG. 1 is a block diagram of a semiconductor chip in a semiconductor memory device according to a first embodiment.

FIG. 2 is a block diagram of a bank in the semiconductor memory device according to the first embodiment.

FIG. 3A is a cross-sectional view of a variable resistor element in the semiconductor memory device according to the first embodiment.

FIG. 3B is a drawing to explain a write operation at the variable resistor element in the semiconductor memory device according to the first embodiment, and is a cross-sectional view of the variable resistor element in a parallel state.

FIG. 3C is a drawing to explain a write operation at the variable resistor element in the semiconductor memory device according to the first embodiment, and is a cross-sectional view of the variable resistor element in an anti-parallel state.

DETAILED DESCRIPTION

Figure 4:
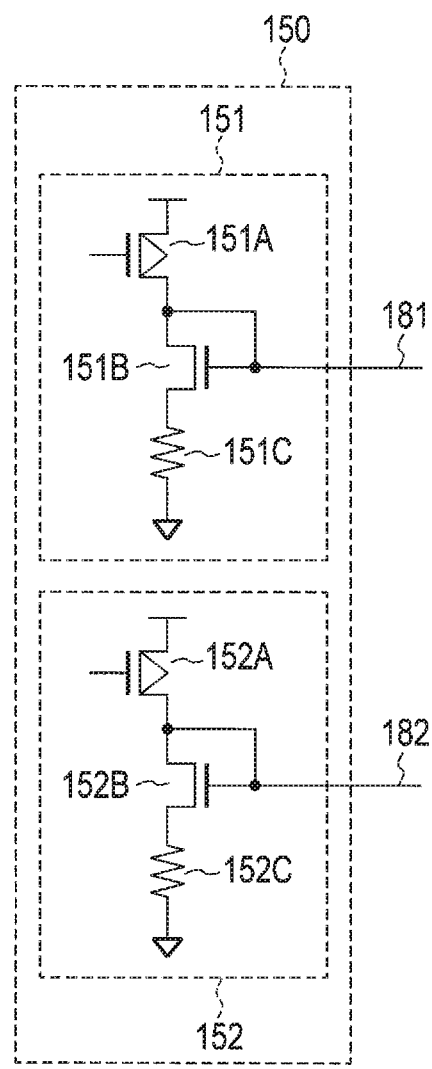
FIG. 4 is a circuit diagram of a voltage generating circuit in the semiconductor memory device according to the first embodiment.

In general, according to one embodiment, a semiconductor memory device comprises a first bank and a second bank. Each of the first bank and the second bank comprises a memory cell having a variable resistor element, a reference cell, a sense amplifier having a first input terminal electrically coupled to the memory cell and a second input terminal electrically coupled to the reference cell, and a first transistor electrically coupling the memory cell and the first input terminal of the sense amplifier. A gate of the first transistor of the first bank and a gate of the first transistor of the second bank are independently supplied with a voltage.

Hereinafter, embodiments will be described with reference to the drawings. In the drawings, like reference symbols denote like parts.

First Embodiment

A semiconductor memory device according to the first embodiment will be explained with reference to FIG. 1 to FIG. 7.

In the first embodiment, a distributor 160_0 is provided for a bank BK0, and a distributor 160_1 is provided for a bank BK1. A reference voltage line 192 is separate and independent between the banks BK0 and BK1 and a clamp voltage line 191 is separate and independent between the banks BK0 and BK1. This can suppress swing of the reference voltage line 192 and the clamp voltage line 191 associated with bank interleave, and prevent erroneous sensing. The first embodiment is detailed below.

Configuration Example and Operation Example of Semiconductor Chip in First Embodiment Herein, an MRAM for storing data using a magnetoresistive effect element (an MTJ element) as a variable resistor element is explained as an example; however, an MRAM is not limited thereto. The present embodiment is applicable to any general memory which senses a resistance difference between variable resistor elements by converting the resistance difference into a current difference or a voltage difference. Note that in the following explanation the term "couple" should be construed to include not only a direct connection but also a connection through any intervening element, unless otherwise mentioned specifically. One end of a transistor denotes one of a source and a drain, and the other end thereof denotes the other of the source and the drain.

FIG. 1 is a block diagram of a semiconductor chip 100 in the semiconductor memory device according to the first embodiment.

As shown in FIG. 1, the semiconductor chip 100 comprises a plurality of banks BK0-BK3, an address buffer 120, a command decoder 130, an I/O buffer 140, a voltage generating circuit (BGR: Band Gap Reference) 150 and a plurality of distributors 160_0-160_3.

Each of the banks BK0-BK3 includes a memory cell array 10, a sense amplifier 20, a write driver 30, a column decoder 40 and a row decoder 50. The banks BK are the largest activation units that can be selected externally (by a controller which is not shown).

The address buffer 120 supplies addresses (a bank address, a row address and a column address) to each of the banks BK0-BK3.

The command decoder 130 supplies a clock enable inversion signal bCKE, a chip select inversion signal bCS, a clock signal CLK and a clock inversion signal bCLK from the controller to each of the banks BK0-BK3.

The I/O buffer 140 transfers data DQ from the controller to each of the banks BK0-BK3 through a GIO bus 170.

The voltage generating circuit 150 generates a clamp voltage Vc_sb and a reference voltage Vr_sb in accordance with a temperature. The voltage generating circuit 150 supplies the clamp voltage Vc_sb to each of the distributors 160_0-160_3 through a clamp voltage line 181. The voltage generating circuit 150 supplies the reference voltage Vr_sb to each of the distributors 160_0-160_3 through a reference voltage line 182.

The distributors 160_0-160_3 respectively supply a stable clamp voltage Vc based on the clamp voltage Vc_sb from the voltage generating circuit 150 to the banks BK0-BK3 respectively through clamp voltage lines 191_0-191_3. The distributors 160_0-160_3 respectively supply a stable reference voltage Vr based on the reference voltage Vr_sb from the voltage generating circuit 150 to the banks BK0-BK3 respectively through reference voltage lines 192_0-192_3. Thus, the clamp voltage Vc and the reference voltage Vr are supplied to each of the banks BK0-BK3 independently and separately.

Configuration Example and Operation Example of Bank in First Embodiment

FIG. 2 is a block diagram of the bank BK0 in the semiconductor memory device according to the first embodiment. Since the banks BK1-3 are the same as the bank BK0 in configuration, descriptions thereof are omitted.

As shown in FIG. 2, the bank BK0 includes the memory cell array 10, a plurality of sense amplifiers 20<0>-20<N>, a plurality of write drivers 30<0>-30<N>, the column decoder 40 and the row decoder 50.

In the memory cell array 10, a plurality of bit lines BL<0>-BL<N>, a plurality of source lines SL<0>-SL<N>, a plurality of word lines WL<0>-WL<N>, and a plurality of memory cells MC and a plurality of reference resistors Rref<0>-Rref<N> are located. N represents 0, 1, 2, ..., N. In the following descriptions, the above elements are respectively represented simply as the bit line BL, the source line SL, the word line WL, the sense amplifier 20, the write driver 30 and the reference resistor Rref, unless specifically distinguished.

Memory cells MC are respectively located positions where the word lines WL<0>-WL<N> intersect with the bit lines BL<0>-BL<N> and the source lines SL<0>-SL<N>. Thus, the memory cells MC are arranged in a matrix.

The memory cell MC includes, for example, variable resistor element RE and a select transistor ST. One end of the variable resistor element RE is electrically coupled to the bit line BL, and the other end thereof is electrically coupled to one end of the select transistor ST. The other end of the select transistor ST is electrically coupled to the source line SL. A gate of the select transistor ST is electrically coupled to the word line WL. The memory cell MC is selected by turning on the select transistor ST by the word line WL.

The variable resistor element RE is an element the resistance value of which is varied by applying a current (or voltage) to the variable resistor. The variable resistor element RE includes, for example, a phase change element or a ferroelectric element, as well as an MTJ element.

FIG. 3A is a cross-sectional view of a variable resistor element in the semiconductor memory device according to the first embodiment. Herein, as the variable resistor element RE, a storage layer 12, a tunnel barrier layer 13, and a reference layer 14 are mainly presented.

As shown in FIG. 3A, the variable resistor element RE includes a laminated body. The laminated body includes the storage layer 12, the tunnel barrier layer 13 and the reference layer 14. The tunnel barrier layer 13 is provided between the storage layer 12 and the reference layer 14.

The storage layer 12 is a ferromagnetic layer in which a magnetization direction is variable, and has perpendicular magnetic anisotropy. Herein, perpendicular magnetic anisotropy means that a magnetization direction is perpendicular or almost perpendicular with respect to a film surface (top surface/bottom surface). A variable magnetization direction means that a magnetization direction varies with respect to a predetermined write current. Being almost perpendicular means that a remanent magnetization direction falls within the range of $45°<\theta\leq90°$ with respect to a film surface.

The tunnel barrier layer 13 is provided on the storage layer 12. The tunnel barrier layer 13 is a non-magnetic layer, and is made of MgO, for example.

The tunnel barrier layer 14 is provided on the storage layer 13. The reference layer 14 is a ferromagnetic layer in which a magnetization direction is not variable, and has perpendicular magnetic anisotropy. Herein, a non-variable magnetization direction means that a magnetization direction does not vary with respect to a predetermined write current. In other words, the reference layer 14 has a greater inverted energy barrier of the magnetization direction than the storage layer 12 has.

FIG. 3B is a drawing to explain a write operation at the variable resistor element RE in the semiconductor memory device according to the first embodiment, and is a cross-sectional view of the variable resistor element RE in a parallel state (P state). FIG. 3C is a drawing to explain a write operation at the variable resistor element RE in the semiconductor memory device according to the first embodiment, and is a cross-sectional view of the variable resistor element RE in an anti-parallel state (AP state).

The variable resistor element RE is, for example, a spin injection type magnetoresistive effect element. Therefore, when data is written into the variable resistor element RE or data is read from the variable resistor element RE, a current flows bi-directionally in directions perpendicular to a film surface in the variable resistor element RE.

More specifically, data is written into the variable resistor element RE as described below.

As shown in FIG. 3B, when a current flows from the storage layer 12 to the reference layer 14, in other words, when electrons flowing from the reference layer 14 to the storage layer 12 are supplied, the electrons which are spin-polarized in the same direction as the magnetization direction of the reference layer 14 are injected to the storage layer 12. In this case, the magnetization direction of the storage layer 12 is adapted to be the same direction as the magnetization direction of the reference layer 14. Accordingly, the magnetization direction of the reference layer 14 and the magnetization direction of the storage layer 12 will be in a parallel arrangement. In the parallel state, the resistance value of the variable resistor element RE is the lowest. This case is defined as "0" data, for example.

On the other hand, as shown in FIG. 3B, when a current flows from the reference layer 14 to the storage layer 12, in other words, when electrons flowing from the storage layer 12 to the reference layer 14 are supplied, the electrons are reflected by the reference layer 14. Accordingly, electrons which are spin-polarized in the direction opposite to the magnetization direction of the reference layer 14 are injected to the storage layer 12. In this case, the magnetization direction of the storage layer 12 is adapted to be the direction opposite to the magnetization direction of the reference layer 14. Accordingly, the magnetization direction of the reference layer 14 and the magnetization direction of the storage layer 12 are in an anti-parallel arrangement. In the anti-parallel state, the resistance value of the variable resistor element RE is the highest. This case is defined as "1" data, for example.

Data is read out from the variable resistor element RE as described below.

A read current is supplied to the variable resistor element RE. The read current is set to a value which does not cause the magnetization direction of the storage layer 12 to be inverted (a value smaller than the write current). The aforementioned "0" data or "1" data can be read out by detecting a change of the resistance value of the variable resistor element RE at this time.

Again, as shown in FIG. 2, one end of each of the source lines SL<9>-SL<N> is electrically coupled to a ground voltage via a corresponding one of the transistors M5<0>-M5<N>. Gates of the transistors M5<0>-M5<N> are supplied with a signal RDSINK.

One end of each of the bit lines BL<0>-BL<N> is electrically coupled to the first input terminal of the corresponding one of the sense amplifiers 20<0>-20<N> via a corresponding one of clamp transistors M2<0>-M2<N> and a corresponding one of read enable transistors M1<0>-M1<N>. One of the read enable transistors M1<0>-M1<N> and the corresponding one of the clamp transistors M2<0>-M2<N> form a serial current path.

Each of the reference resistors Rref<0>-Rref<N> generates a reference signal (reference current) intermediate between "1" data and "0" data. One end of each of the reference resistors Rref<0>-Rref<N> is electrically coupled to the second input terminal of the corresponding one of the sense amplifiers 20<0>-20<N> via a corresponding one of reference transistors M4<0>-M4<N> and a corresponding one of read enable transistors M3<0>-M3<N>. One of the read enable transistors M3<0>-M3<N> and the corresponding one of the reference transistors M4<0>-M4<N> form a serial current path.

The reference resistor Rref is not limited to a fixed resistor, but may be a reference cell having "1" data and "0" data. The sense amplifier 20 may be of a current detection type or a voltage detection type.

Each of output terminals of the sense amplifiers 20<0>-20<N> is electrically coupled to the GIO bus 170 via a corresponding one of column select transistors M6<0>-M6<N>.

Each of word line drivers 30<0>-30<N> is provided between and electrically coupled to one of the bit lines BL<0>-BL<N> and a corresponding one of the source lines SL<0>-SL<N>.

The word lines WL<0>-WL<N> are supplied with a voltage from the row decoder 50. Gates of the column select transistors M6<0>-M6<N> are respectively supplied with column select signals CSL<0>-CSL<N> from the column decoder 40.

Gates of the read enable transistors M1<0>-M1<N> and M3<0>-M3<N> are supplied with a read enable signal REN_0 by a REN control circuit, which is not shown.

Each of gates of the clamp transistors M2<0<-M2<N> is supplied with a clamp voltage Vc through the clamp voltage line 191 from the distributor 160_0 (clamp voltage distributor 161). Each of gates of the reference transistors M4<0>-M4<N> is supplied with a reference voltage Vr through the clamp voltage line 192 from the distributor 160_0 (reference voltage distributor 162).

In a read operation, the row decoder 50 selects any one of the word lines WL<0>-WL<N> in accordance with a row address. Thereafter, the sense amplifiers 20<0>-20<N> are activated and cell data are read out (sensed). The read data is stored in a latch, which is not shown. The column decoder 40 supplies one of signals CSL<0>-CSL<N> in accordance with a column address, and selects one of the sense amplifiers 20<0>-20<N>. Then, the data of the selected sense amplifier 20<0>-20<N> (latch) is read out to the GIO bus 170.

In a write operation, one of the write drivers 30<0>-30<N> is selected in accordance with a column address. Data of the GIO bus 170 is transferred to the selected write driver 30<0>-30<N>, and the write driver 30<0>-30<N> writes the data in the memory cell MC.

Configuration Example and Operation Example of Voltage Generating Circuit in First Embodiment FIG. 4 is a circuit diagram of the voltage generating circuit 150 in the semiconductor memory device according to the first embodiment.

As shown in FIG. 4, the voltage generating circuit 150 comprises a clamp voltage generating circuit 151 and a reference voltage generating circuit 152.

The clamp voltage generating circuit 151 includes a pMOS transistor 151A, an nMOS transistor 151B and a resistor 151C. One end of the pMOS transistor 151A is electrically coupled to a power supply voltage, and the other end thereof is electrically coupled to one end of the nMOS transistor 151B. One end (drain) and a gate of the nMOS transistor 151B are electrically coupled and diode-coupled. The other end of the nMOS transistor 151B is electrically coupled to one end of the resistor 151C. The other end of the resistor 151C is coupled to a ground voltage. The clamp voltage generating circuit 151 supplies the clamp voltage Vc_sb to the clamp voltage line 181 from the gate of the nMOS transistor 151B.

The reference voltage generating circuit 152 includes a pMOS transistor 152A, an nMOS transistor 152B and a resistor 152C. It has a configuration similar to that of the clamp voltage generating circuit 151. The reference voltage generating circuit 152 supplies the reference voltage Vr_sb to the reference voltage line 182 from the gate of the nMOS transistor 152B.

Configuration Example and Operation Example of Distributor in First Embodiment

Figure 5:
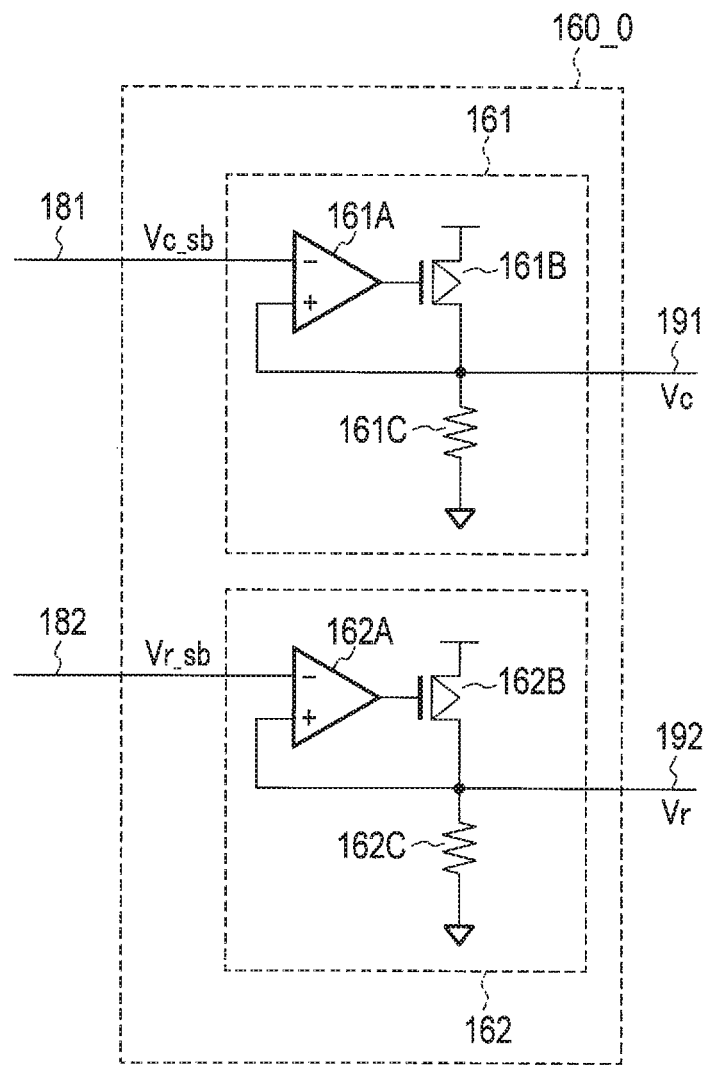
FIG. 5 is a circuit diagram of a distributor in the semiconductor memory device according to the first embodiment.

FIG. 5 is a circuit diagram of the distributor 160_0 in the semiconductor memory device according to the first embodiment. Since the distributors 160_1-160_3 are the same as the distributor 160_0 in configuration, descriptions thereof are omitted.

As shown in FIG. 5, the distributor 160_0 comprises the clamp voltage distributor 161 and the reference voltage distributor 162.

The clamp voltage distributor 161 includes an operational amplifier 161A, a pMOS transistor 161B and a resistor 161C.

A first input terminal (negative terminal) of the operational amplifier 161A is electrically coupled to the clamp voltage line 181. An output terminal of the operational amplifier 161A is electrically coupled to a gate of the nMOS transistor 161B. One end of the pMOS transistor 161B is electrically coupled to the power supply voltage, and the other end thereof is electrically coupled to a second input terminal (positive terminal) of the operational amplifier 161A and the resistor 161C. The other end of the resistor 161C is electrically coupled to the ground voltage. The clamp voltage distributor 161 supplies the clamp voltage Vc to the clamp voltage line 191 from the other end of the pMOS transistor 161B.

In the clamp voltage distributor 161, the operational amplifier 161A compares the clamp voltage Vc_sb input from the clamp voltage line 181 with the clamp voltage Vc output to the clamp voltage line 191. If the clamp voltage Vc is lower than the clamp voltage Vc_sb, the operational amplifier 161A outputs an L (low) level signal. As a result, the pMOS transistor 161B is turned on and the clamp voltage Vc is increased by the power supply voltage. On the other hand, if the clamp voltage Vc is higher than the clamp voltage Vc_sb, the operational amplifier 161A outputs an H (high) level signal. As a result, the pMOS transistor 161B is turned off and the clamp voltage Vc is decreased by the ground voltage. Thus, the clamp voltage distributor 161 adjusts the clamp voltage Vc to be equal to the clamp voltage Vc_sb. Accordingly, even if the clamp voltage Vc swings due to noise, the clamp voltage Vc returns to the clamp voltage Vc_sb to be stable.

The reference voltage distributor 162 includes an operational amplifier 162A, a pMOS transistor 162B and a resistor 162C. It has a configuration similar to that of the clamp voltage distributor 161. The reference voltage distributor 162 supplies the reference voltage Vr to the reference voltage line 192 from the other end of the pMOS transistor 162B.

In the reference voltage distributor 162, the operational amplifier 162A compares the reference voltage Vr_sb input from the reference voltage line 182 with the reference voltage Vr output to the reference voltage line 192. If the reference voltage Vr is lower than the reference voltage Vr_sb, the operational amplifier 162A outputs an L level signal. As a result, the pMOS transistor 162B is turned on and the reference voltage Vr is increased by the power supply voltage. On the other hand, if the reference voltage Vr is higher than the reference voltage Vr_sb, the operational amplifier 162A outputs an H level signal. As a result, the pMOS transistor 162B is turned off and the reference voltage Vr is decreased by the ground voltage. Thus, the reference voltage distributor 162 adjusts the reference voltage Vr to be equal to the reference voltage Vr_sb. Accordingly, even if the reference voltage Vr swings due to noise, the reference voltage Vr returns to the reference voltage Vr_sb to be stable.

Read Operation in First Embodiment

Figure 6:
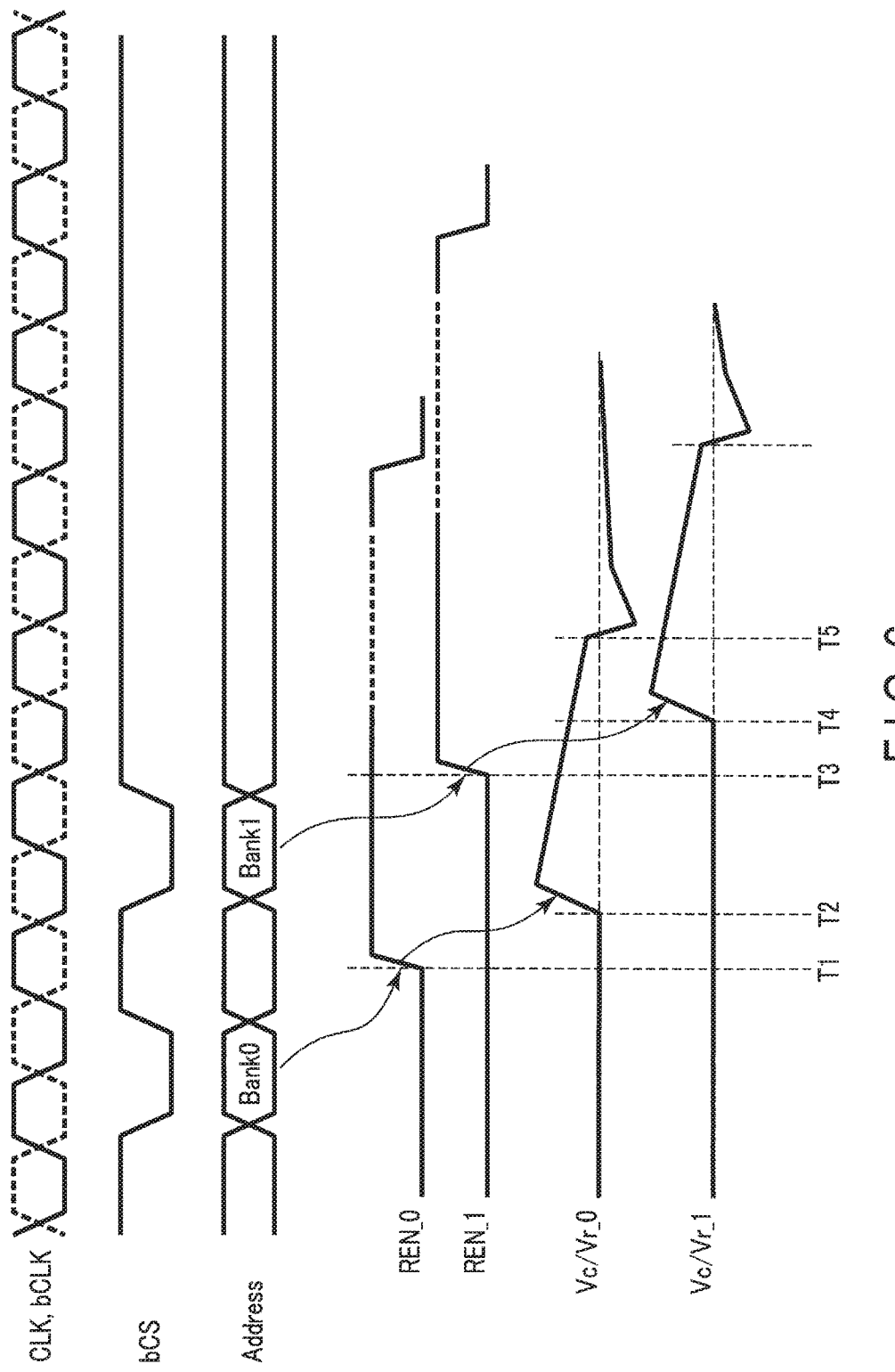
FIG. 6 is a diagram of voltage waveforms of bank interleave in a read operation in the semiconductor memory device according to the first embodiment.

FIG. 6 is a diagram of voltage waveforms of bank interleave in a read operation in the semiconductor memory device according to the first embodiment.

As shown in FIG. 6, in the read operation, by input of a clock signal CLK and a clock inversion signal bCLK, when a chip select inversion signal bCS becomes L level and when an address Bank0 is input, the bank BK0 is activated. As a result, at time T1, a read enable signal REN_0 in the bank BK0 becomes H level. Further, the sense amplifier 20, the word line WL and the like in the bank BK0 are also activated. At this time, since the read enable signal REN_0 becomes H level, the clamp voltage Vc_0 and the reference voltage Vr_0 of an M (middle) level in the bank BK0 raises by coupling at time T2. Thereafter, the clamp voltage Vc_0 and the reference voltage Vr_0 lower to the M level.

On the other hand, while the bank BK0 is being activated, by input of the clock signal CLK and the clock inversion signal bCLK, when the chip select inversion signal bCS becomes L level and when an address Bank1 is input, the bank BK1 is activated. As a result, at time T3 a read enable signal REN_1 in the bank BK1 becomes H level. Further, the sense amplifier 20, the word line WL and the like in the bank BK1 are also activated. At this time, the read enable signal REN_1 becomes H level, the clamp voltage Vc_1 and the reference voltage Vr_1 of an M level in the bank BK1 raises by coupling at time T4. Thereafter, the clamp voltage Vc_1 and the reference voltage Vr_1 lower to the M level.

Thus, the bank BK0 and the bank BK1 receive addresses (row addresses) at different timings, and are individually activated accordingly.

At this time, in the first embodiment, the clamp voltage Vc_0 and the reference voltage Vr_0 for the bank BK0 and the clamp voltage Vc_1 and the reference voltage Vr_1 for the bank BK1 are supplied separately and independently. More specifically, the clamp voltage Vc_0 and the reference voltage Vr_0 for the bank BK0 are supplied from the distributor 160_0 and the clamp voltage Vc_1 and the reference voltage Vr_1 for the bank BK1_ are supplied from the distributor 160_1. Therefore, even if noise is generated in the clamp voltage Vc_1 and the reference voltage Vr_1 due to coupling or the like, no influence will be exerted on the clamp voltage Vc_0 and the reference voltage Vr_0. Accordingly, at time T5 when the clamp voltage Vc_0 and the reference voltage Vr_0 are stabilized, a sense operation of the bank BK0 is carried out without taking noise of the clamp voltage Vc_1 and the reference voltage Vr_11 into consideration.

Effect of First Embodiment

Figure 7:
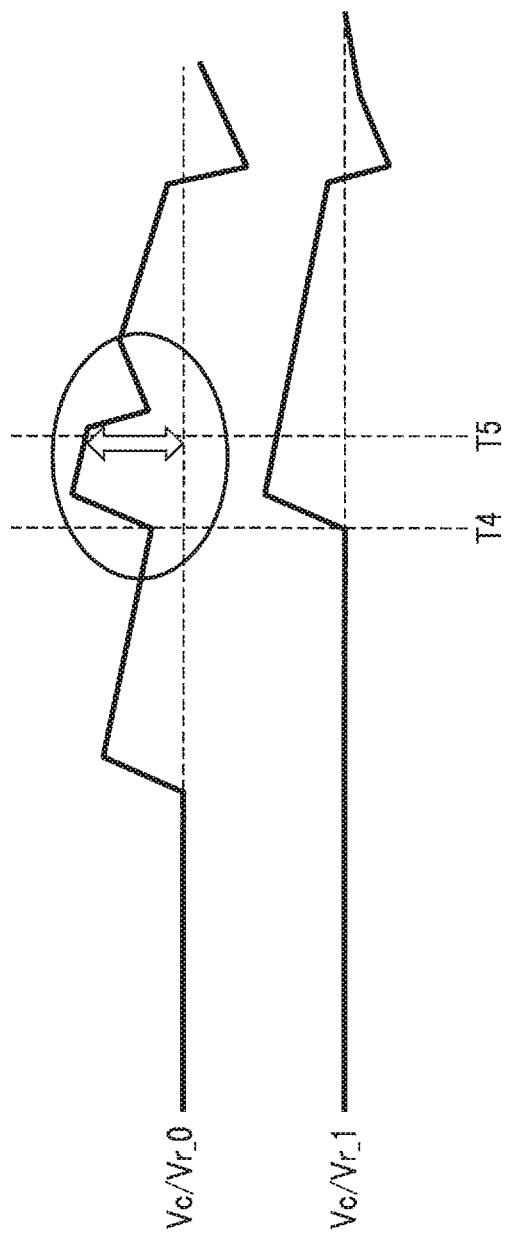
FIG. 7 is a diagram of voltage waveforms of bank interleave in a read operation in a semiconductor memory device according to a comparative example.

FIG. 7 is a diagram of voltage waveforms of bank interleave in a read operation in a semiconductor memory device according to a comparative example. When bank interleave is performed in a read operation, as shown in FIG. 7, the bank BK1 begins to be activated while the bank BK0 is activated. At this time, for example, when the bank BK0 is sensed at time T5, noise is generated in the clamp voltage Vc_1 and the reference voltage Vr_1 in the bank BK1. In the comparative example, the reference voltage line and the clamp voltage line are not separate but coupled in common between the banks BK0 and BK1. Therefore, noise in the clamp voltage Vc_1 and the reference voltage Vr_1 will also influence the clamp voltage Vc_0 and the reference voltage Vr_0 of the bank BK0. As a result, erroneous sensing will occur in sensing of the bank BK0.

In contrast, according to the first embodiment, the distributor 160_0 is provided for the bank BK0, and the distributor 160_1 is provided for the bank BK1. The distributors 160_0 and 160_1 make the reference voltage line 192 (192_0 and 192_1) to be separate and independent from each other between the banks BK0 and BK1 and make the clamp voltage line 191 (191_0 and 191_1) to be separate and independent from each other between the banks BK0 and BK1. In other words, the clamp voltage Vc_0 and the reference voltage Vr_0 for the bank BK0 are supplied separately and independently from the clamp voltage Vc_1 and the reference voltage Vr_1 for the bank BK1.

Therefore, even if noise is generated in the reference voltage line 192 and the clamp voltage line 191, for example, on the side of the bank BK1 (the clamp voltage Vc_1 and the reference voltage Vr_1), the noise will not influence the reference voltage line 192 and the clamp voltage line 191 on the side of the bank BK0 (the clamp voltage Vc_0 and the reference voltage Vr_0). Therefore, swing of the reference voltage line 192 and the clamp voltage line 191 associated with bank interleave can be suppressed, and erroneous sensing can be prevented.

Second Embodiment

A semiconductor memory device according to a second embodiment will be explained with reference to FIG. 8 and FIG. 10.

In the second embodiment, the clamp voltage distributor 161 comprises an address controller 161I and the reference voltage distributor 162 comprises an address controller 162I. Because of this, a plurality of kinds of clamp voltages Vc and reference voltages Vr can be supplied in accordance with row addresses, and a sufficient sense margin can be ensured.

The second embodiment is detailed below. In the following, explanations of the second embodiment which are similar to those of the first embodiment are omitted, and differences from the first embodiment will be explained mainly.

Configuration Example and Operation Example of Distributor in Second Embodiment

Figure 8:
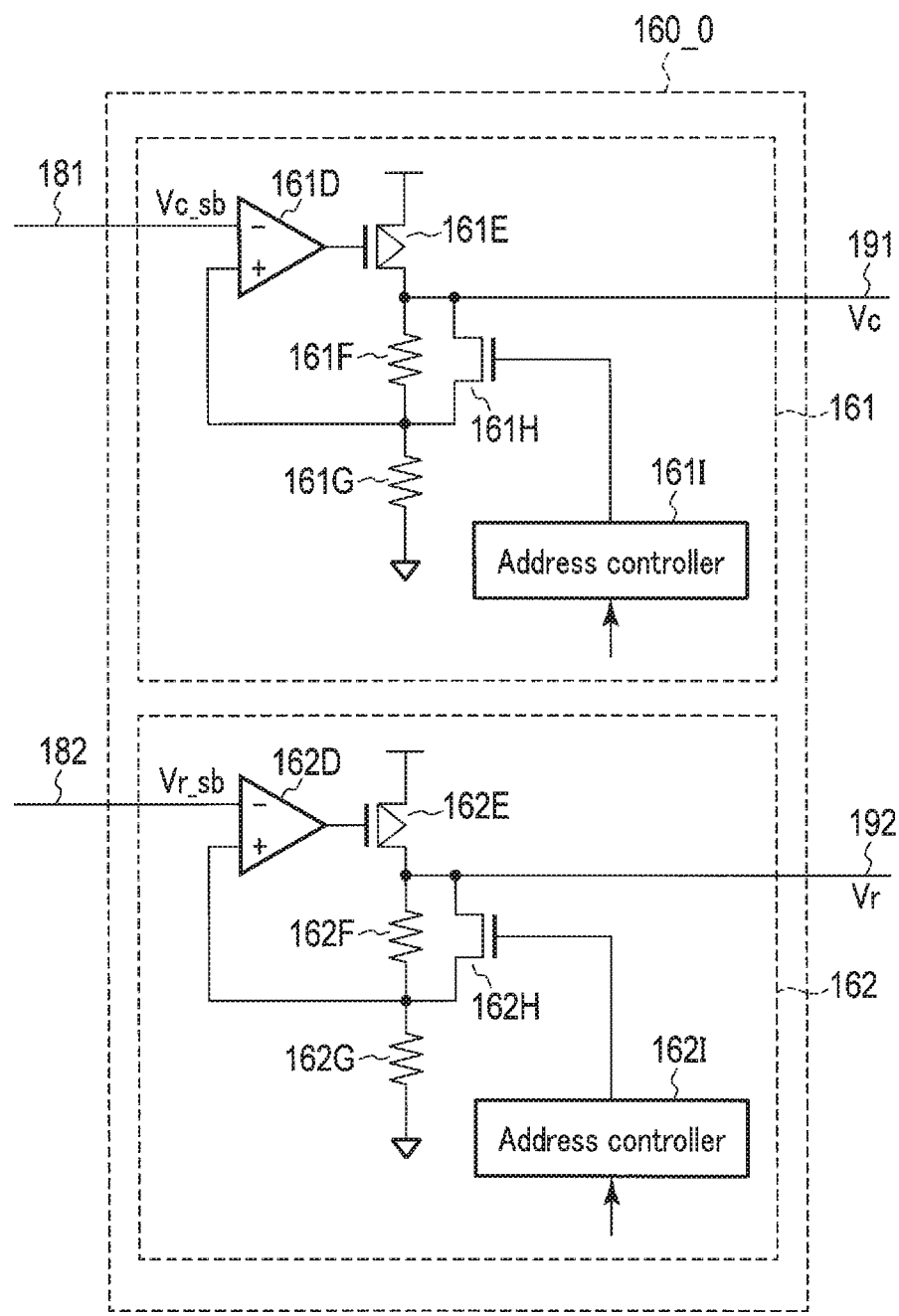
FIG. 8 is a circuit diagram of a distributor in a semiconductor memory device according to a second embodiment.

FIG. 8 is a circuit diagram of the distributor 160_0 in the semiconductor memory device according to the second embodiment. Since the distributors 160_1-160_3 are the same as the distributor 160_0 in configuration, descriptions thereof are omitted.

As shown in FIG. 8, the clamp voltage distributor 161 includes an operational amplifier 161D, a pMOS transistor 161E, resistors 161F and 161G, an nMOS transistor 161H, and an address controller 161I.

A first input terminal of the operational amplifier 161D is electrically coupled to the clamp voltage line 181. An output terminal of the operational amplifier 161D is electrically coupled to a gate of the pMOS transistor 161E. One end of the pMOS transistor 161E is electrically coupled to a power supply voltage, and the other end thereof is electrically coupled to one end of the resistor 161F and one end of the nMOS transistor 161H. The other end of the resistor 161F and the other end of the nMOS transistor 161H are electrically coupled to one end of the resistor 161G and a second input terminal of the operational amplifier 161D. The other end of the resistor 161G is electrically coupled to the ground voltage. A gate of the nMOS transistor 161H is supplied with a signal from the address controller 161I in accordance with an address. The clamp voltage distributor 161 supplies the clamp voltage Vc to the clamp voltage line 191 from the other end of the pMOS transistor 161E.

The reference voltage distributor 162 includes an operational amplifier 162D, a pMOS transistor 162E, resistors 162F and 162G, an nMOS transistor 162H, and an address controller 162I. It has a configuration similar to that of the clamp voltage distributor 161. The reference voltage distributor 162 supplies the reference voltage Vr to the reference voltage line 192 from the other end of the pMOS transistor 162E.

Figure 9:
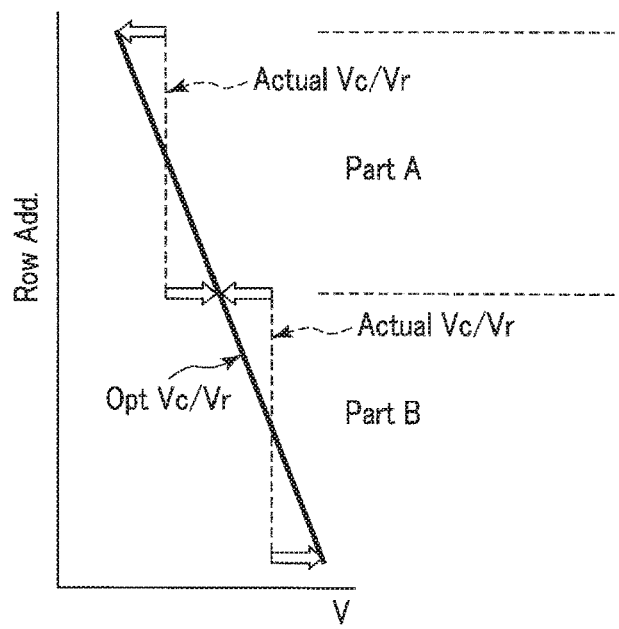
FIG. 9 is a graph showing a relationship of a row address to optimum values and actual values of a clamp voltage Vc and a reference voltage Vr in a semiconductor memory device according to the second embodiment.

FIG. 9 is a graph showing a relationship of a row address to optimum values and actual values of a clamp voltage Vc and a reference voltage Vr in a semiconductor memory device according to the second embodiment.

As shown in FIG. 9, the optimum values of the clamp voltage Vc and the reference voltage Vr differ depending on row addresses in each bank (a solid line). This is because of a difference in parasitic resistance of the bit line BL and the source line depending on row addresses. For example, the upper the row address, the lower the optimum values of the clamp voltage Vc and the reference voltage Vr, and the lower the row address, the higher the optimum values of the clamp voltage Vc and the reference voltage Vr.

In contrast, according to the second embodiment, two kinds of values are used as values (actual values) of the clamp voltage Vc and the reference voltage Vr to be actually supplied depending on row addresses (broken lines). More specifically, in the case of a row address on an upper side (Part A), actual values of the clamp voltage Vc and the reference voltage Vr are set smaller. In the case of a row address on a lower side (Part B), actual values of the clamp voltage Vc and the reference voltage Vr are set larger. Operation of the distributor 160_0 for the aforementioned control will be explained below.

Again, as shown in FIG. 8, in the clamp voltage distributor 161, the address controller 161I receives a row address and supplies an H level or L level signal in accordance with the row address to the gate of the nMOS transistor 161H.

If the row address is on the upper side, the address controller 161I supplies the H level signal. As a result, the nMOS transistor 161H is turned on, and the clamp voltage Vc to be output is input to the second input terminal of the operational amplifier 161D via the nMOS transistor 161H. In other words, substantially the same voltage as the clamp voltage Vc to be output is input to the second input terminal of the operational amplifier 161D. Thus, the clamp voltage distributor 161 outputs the clamp voltage Vc to be equal to the clamp volt Vc_sb.

On the other hand, if the row address is on the lower side, the address controller 161I supplies the L level signal. As a result, the nMOS transistor 161H is turned off, and the clamp voltage Vc to be output is input to the second input terminal of the operational amplifier 161D via the resistor 161F. In other words, voltage [Vc−Δ], which is smaller than the clamp voltage Vc, is input to the second input terminal of the operational amplifier 161D. Assuming that a resistance of the resistor 161F is represented as R1 and a current flowing through the resistor 161F is represented as i, the equation Δ=R1×i holds. Thus, the clamp voltage distributor 161 outputs the clamp voltage Vc such that the voltage [Vc−Δ] is equal to the clamp voltage Vc_sb, that is, the clamp voltage Vc is equal to a voltage [Vc_sb+Δ].

As described above, the clamp voltage distributor 161 outputs a lower clamp voltage Vc if the row address is on an upper side, and outputs a higher clamp voltage Vc if the row address is on a lower side.

Similarly, the reference voltage distributor 162 outputs a lower clamp voltage Vr if the row address is on an upper side, and outputs a higher clamp voltage Vr if the row address is on a lower side.

Effect of Second Embodiment

Figure 10:
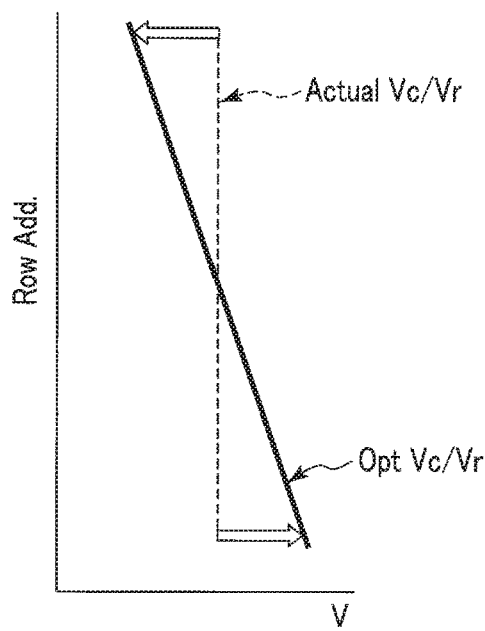
FIG. 10 is a graph showing a relationship of a row address to optimum values and actual values of a clamp voltage Vc and a reference voltage Vr in a semiconductor memory device according to a comparative example.

FIG. 10 is a graph showing a relationship of a row address to optimum values and actual values of a clamp voltage Vc and a reference voltage Vr in a semiconductor memory device according to the comparative example. As shown in FIG. 10, in the comparative example, the clamp voltage Vc and the reference voltage Vr are not adjusted depending on row addresses, and there is one kind of actual value for each of the clamp voltage Vc and the reference voltage Vr. Therefore, in the case of a row address of end portions, for example (the highest or lowest order), the actual values of the clamp voltage Vc and the reference voltage Vr are considerably different from the optimum values of the clamp voltage Vc and the reference voltage Vr. Accordingly, the sense margin will be degraded.

In contrast, according to the second embodiment, the clamp voltage distributor 161 comprises the address controller 161I and the reference voltage distributor 162 comprises the address controller 162I. By control of the address controllers 161I and 162I, the clamp voltage distributor 161 and the reference voltage distributor 162 can supply a plurality of kinds (in the embodiment, two kinds) of values of the clamp voltages Vc and the reference voltages Vr depending on row addresses. Because of this, the difference between an optimum value of each of the clamp voltage Vc and the reference voltage Vr and an actual value of each of the clamp voltage Vc and the reference voltage Vr can be reduced, and a sufficient sense margin can be ensured.

In the second embodiment, each of the clamp voltage distributor 161 and the reference voltage distributor 162 supplies two kinds of values of the clamp voltages Vc and reference voltages Vr depending on row addresses; however, the invention is not limited to this embodiment. Each of the clamp voltage distributor 161 and the reference voltage distributor 162 may supply three or more kinds of values of the clamp voltages Vc and reference voltages Vr depending on row addresses.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first bank and a second bank,
wherein each of the first bank and the second bank comprises:
  a memory cell including a variable resistor;
  a reference cell;
  a sense amplifier including a first input terminal electrically coupled to the memory cell and a second input terminal electrically coupled to the reference cell; and
  a first transistor electrically coupling the memory cell and the first input terminal of the sense amplifier, and
wherein:
  a gate of the first transistor of the first bank and a gate of the first transistor of the second bank are independently supplied with a voltage,
  the second bank is activated while the first bank is being activated in a read operation,
  the first bank is activated by changing a first signal from a first level to a second level based on an input of a first bank address, and
  the second bank is activated by changing a second signal from the first level to the second level based on an input of a second bank address.

2. The device of claim 1, further comprising:
a first voltage generating circuit which generates a first voltage;
a first distributor which generates a second voltage based on the first voltage and supplies the second voltage to the gate of the first transistor of the first bank; and
a second distributor which generates a third voltage based on the first voltage and supplies the third voltage to the gate of the first transistor of the second bank.

3. The device of claim 2, wherein:
the first distributor comprises:
  a first operational amplifier including a first input terminal to which the first voltage is input and a second input terminal to which the second voltage is input;
  a second transistor including a gate electrically coupled to an output terminal of the first operational amplifier, one end electrically coupled to a power supply voltage, and the other end which outputs the second voltage; and
  a first resistor including one end electrically coupled to the other end of the second transistor, and the other end coupled to a ground voltage, and
the second distributor comprises:
  a second operational amplifier including a first input terminal to which the first voltage is input and a second input terminal to which the third voltage is input;
  a third transistor including a gate electrically coupled to an output terminal of the second operational amplifier, one end electrically coupled to the power supply voltage, and the other end which outputs the third voltage; and
  a second resistor including one end electrically coupled to the other end of the second third transistor, and the other end coupled to the ground voltage.

4. The device of claim 2, wherein:
the first distributor varies the second voltage depending on a row address; and
the second distributor varies the third voltage depending on a row address.

5. The device of claim 2, wherein:
the first distributor comprises:
  a third operational amplifier including a first input terminal to which the first voltage is input;
  a fourth transistor including a gate electrically coupled to an output terminal of the third operational amplifier, one end electrically coupled to a power supply voltage, and the other end which outputs the second voltage;
  a third resistor including one end electrically coupled to the other end of the fourth transistor, and the other end electrically coupled to a second input terminal of the third operational amplifier;
  a fifth transistor including one end electrically coupled to the other end of the fourth transistor, and the other end electrically coupled to the second input terminal of the third operational amplifier;
  a fourth resistor including one end electrically coupled to the other end of the fifth transistor and the other end of the third resistor, and the other end electrically coupled to a ground voltage; and a first address controller which supplies a signal in accordance with a row address to a gate of the fifth transistor, and the second distributor comprises:
a fourth operational amplifier including a first input terminal to which the first voltage is input;
a sixth transistor including a gate electrically coupled to an output terminal of the fourth operational amplifier, one end electrically coupled to the power supply voltage, and the other end which outputs the third voltage;
a fifth resistor including one end electrically coupled to the other end of the sixth transistor, and the other end electrically coupled to a second input terminal of the fourth operational amplifier;
a seventh transistor including one end electrically coupled to the other end of the sixth transistor, and the other end electrically coupled to the second input terminal of the fourth operational amplifier;
a sixth resistor including one end electrically coupled to the other end of the seventh transistor and the other end of the fifth resistor, and the other end electrically coupled to the ground voltage; and
a second address controller which supplies a signal in accordance with a row address to a gate of the seventh transistor.

6. The device of claim 1, wherein:
each of the first bank and the second bank comprises an eighth transistor electrically coupling the reference cell and the second input terminal of the sense amplifier; and
a gate of the eighth transistor of the first bank and a gate of the eighth transistor of the second bank are independently supplied with a voltage.

7. The device of claim 6, further comprising:
a second voltage generating circuit which generates a fourth voltage;
a third distributor which generates a fifth voltage based on the fourth voltage and supplies the fifth voltage to the gate of the eighth transistor of the first bank; and
a fourth distributor which generates a sixth voltage based on the fourth voltage and supplies the sixth voltage to the gate of the eighth transistor of the second bank.

8. The device of claim 7, wherein:
the third distributor comprises:
a fifth operational amplifier including a first input terminal to which the fourth voltage is input and a second input terminal to which the fifth voltage is input;
a ninth transistor including a gate electrically coupled to an output terminal of the fifth operational amplifier, one end electrically coupled to a power supply voltage, and the other end which outputs the fifth voltage; and
a seventh resistor including one end electrically coupled to the other end of the ninth transistor, and the other end coupled to a ground voltage, and the fourth distributor comprises:
a sixth operational amplifier including a first input terminal to which the fourth voltage is input and a second input terminal to which the sixth voltage is input;
a tenth transistor including a gate electrically coupled to an output terminal of the sixth operational amplifier, one end electrically coupled to the power supply voltage, and the other end which outputs the sixth voltage; and an eighth resistor including one end electrically coupled to the other end of the tenth transistor, and the other end coupled to the ground voltage.

9. The device of claim 7, wherein:
the third distributor varies the fifth voltage depending on a row address; and
the fourth distributor varies the sixth voltage depending on a row address.

10. The device of claim 7, wherein:
the third distributor comprises:
a seventh operational amplifier including a first input terminal to which the fourth voltage is input;
an eleventh transistor including a gate electrically coupled to an output terminal of the seventh operational amplifier, one end electrically coupled to a power supply voltage, and the other end which outputs the fifth voltage;
a ninth resistor including one end electrically coupled to the other end of the eleventh transistor, and the other end electrically coupled to a second input terminal of the seventh operational amplifier;
a twelfth transistor including one end electrically coupled to the other end of the eleventh transistor, and the other end electrically coupled to the second input terminal of the seventh operational amplifier;
a tenth resistor including one end electrically coupled to the other end of the twelfth transistor and the other end of the ninth resistor, and the other end electrically coupled to a ground voltage; and
a third address controller which supplies a signal in accordance with a row address to a gate of the twelfth transistor, and the fourth distributor comprises:
an eighth operational amplifier including a first input terminal to which the fourth voltage is input;
a thirteenth transistor including a gate electrically coupled to an output terminal of the eighth operational amplifier, one end electrically coupled to the power supply voltage, and the other end which outputs the sixth voltage;
an eleventh resistor including one end electrically coupled to the other end of the thirteenth transistor, and the other end electrically coupled to a second input terminal of the eighth operational amplifier;
a fourteenth transistor including one end electrically coupled to the other end of the thirteenth transistor, and the other end electrically coupled to the second input terminal of the eighth operational amplifier;
a twelfth resistor including one end electrically coupled to the other end of the fourteenth transistor and the other end of the eleventh resistor, and the other end electrically coupled to the ground voltage; and
a fourth address controller which supplies a signal in accordance with a row address to a gate of the fourteenth transistor.

11. A semiconductor memory device comprising:
a first bank and a second bank,
wherein each of the first bank and the second bank comprises:
a memory cell including a variable resistor;
a reference cell;
a sense amplifier including a first input terminal electrically coupled to the memory cell and a second input terminal electrically coupled to the reference cell; and a first transistor electrically coupling the reference cell and the first second input terminal of the sense amplifier, and wherein:
a gate of the first transistor of the first bank and a gate of the first transistor of the second bank are independently supplied with a voltage,
the second bank is activated while the first bank is being activated in a read operation,
the first bank is activated by changing a first signal from a first level to a second level based on an input of a first bank address, and
the second bank is activated by changing a second signal from the first level to the second level based on an input of a second bank address.

12. The device of claim 11, further comprising:
a first voltage generating circuit which generates a first voltage;
a first distributor which generates a second voltage based on the first voltage and supplies the second voltage to the gate of the first transistor of the first bank; and
a second distributor which generates a third voltage based on the first voltage and supplies the third voltage to the gate of the first transistor of the second bank.

13. The device of claim 11, wherein:
the first distributor comprises:
a first operational amplifier including a first input terminal to which the first voltage is input and a second input terminal to which the second voltage is input;
a second transistor including a gate electrically coupled to an output terminal of the first operational amplifier, one end electrically coupled to a power supply voltage, and the other end which outputs the second voltage; and
a first resistor including one end electrically coupled to the other end of the second transistor, and the other end coupled to a ground voltage, and
the second distributor comprises:
a second operational amplifier including a first input terminal to which the first voltage is input and a second input terminal to which the third voltage is input;
a third transistor including a gate electrically coupled to an output terminal of the second operational amplifier, one end electrically coupled to the power supply voltage, and the other end which outputs the third voltage; and
a second resistor including one end electrically coupled to the other end of the third transistor, and the other end coupled to the ground voltage.

14. The device of claim 13, wherein:
the first distributor varies the second voltage depending on a row address, and
the second distributor varies the third voltage depending on a row address.

15. The device of claim 13, wherein:
the first distributor comprises:
a third operational amplifier including a first input terminal to which the first voltage is input;
a fourth transistor including a gate electrically coupled to an output terminal of the third operational amplifier, one end electrically coupled to a power supply voltage, and the other end which outputs the second voltage;
a third resistor including one end electrically coupled to the other end of the fourth transistor, and the other end electrically coupled to a second input terminal of the third operational amplifier;
a fifth transistor including one end electrically coupled to the other end of the fourth transistor, and the other end electrically coupled to the second input terminal of the third operational amplifier;
a fourth resistor including one end electrically coupled to the other end of the fifth transistor and the other end of the third resistor, and the other end electrically coupled to a ground voltage; and
a first address controller which supplies a signal in accordance with a row address to a gate of the fifth transistor, and
the second distributor comprises:
a fourth operational amplifier including a first input terminal to which the first voltage is input;
a sixth transistor including a gate electrically coupled to an output terminal of the fourth operational amplifier, one end electrically coupled to the power supply voltage, and the other end which outputs the third voltage;
a fifth resistor including one end electrically coupled to the other end of the sixth transistor, and the other end electrically coupled to a second input terminal of the fourth operational amplifier;
a seventh transistor including one end electrically coupled to the other end of the sixth transistor, and the other end electrically coupled to the second input terminal of the fourth operational amplifier;
a sixth resistor including one end electrically coupled to the other end of the seventh transistor and the other end of the fifth resistor, and the other end electrically coupled to the ground voltage; and
a second address controller which supplies a signal in accordance with a row address to a gate of the seventh transistor.

* * * * *